METHOD OF FORMING ALLOYED REGIONS IN SEMICONDUCTOR BODIES

Filed June 8, 1961 2 Sheets-Sheet 1

INVENTOR
J. L. WINKELMAN
By A J Nugent
ATTORNEY

METHOD OF FORMING ALLOYED REGIONS IN SEMICONDUCTOR BODIES

Filed June 8, 1961 2 Sheets-Sheet 2

EVAPORATION CYCLE WITH AL EMITTER

EVAPORATION CYCLE WITH AL-GE EMITTER

INVENTOR
J. L. WINKELMAN

BY A J Nugent

ATTORNEY

United States Patent Office 3,167,462

Patented Jan. 26, 1965

3,167,462
METHOD OF FORMING ALLOYED REGIONS IN SEMICONDUCTOR BODIES

John L. Winkelman, Reading, Pa., assignor to Western Electric Company, Incorporated, a corporation of New York Filed June 8, 1961, Ser. No. 115,663
5 Claims. (Cl. 148—180)

This invention relates to a method of manufacturing semiconductors, to semiconductor products, and particularly to forming alloyed regions in semiconductor bodies.

In the manufacture of certain transistors, two small stripes are customarily formed parallel to each other on the surface of a semiconductor body. In one type of transistor, known as the diffused base transistor, an n-type base is diffused into the surface of a p-type germanium body. The stripes are thereafter formed by successively evaporating aluminum and gold in a chamber or bell jar and depositing these metals on the base through an opening in a mask. The aluminum and gold stripes respectively constitute the emitter and base contacts of a transistor. After the aluminum is vaporized, the temperature of the germanium body is raised above the eutectic melting point to form an alloyed emitter contact defining a p-n junction. Thereafter, the gold is evaporated and deposited on the base and the temperature is raised above the eutectic melting point to form an alloyed ohmic base contact.

Formation of the stripes has presented a particularly bothersome problem brought on largely by the minute dimensions of tthe stripe itself, and the likewise minute thickness of the base region. The control of the alloying temperature for the stripes has been especially critical. It has been necessary in the past to raise the temperature relatively rapidly from a stabilization temperature to a peak alloying condition and then to rapidly lower it. In such a procedure, there was always the danger of overshooting the temperature peak or of holding the temperature in the high temperature peak region for too long a period. As a result, there was a tendency for the deposited metal to actually puncture or break through the base layer at one or more points and short-circuit the transistor at the emitter-collector junction in the case of the emitter contact, or to "crater," that is, to form one or more non-wetted regions in the stripe area completely devoid of aluminum. The latter condition obviously resulted in poor electrical and mechanical connection. Similar problems were encountered in the case of the gold stripe, but apparently, since a relatively smaller amount of metal is used in the base contact, the problem of puncture through has not been as great. The over-all effect of the prior technique was that a product of limited yield was produced.

One object of the present invention is an improved method of making metallic contacts for semiconductor devices. Other objects include the forming of semiconductor contacts under less exacting control conditions, and the production of semiconductor contacts having improved electrical and mechanical characteristics. Still further objects are a semiconductor having one or more uniformly alloyed regions, and a semiconductor having one or more alloyed junction regions.

The invention provides for evaporating both a semiconductor material and a metallic contact material to deposit the evaporated material on a semiconductor body and alloying the deposited material with the semiconductor body. The evaporated semiconductor material should preferably be of the same elemental type as the material of the semiconductor body. For example, if the semiconductor body is of silicon, the semiconductor material used in the charge should likewise be silicon. The semiconductor used in the charge may include an appropriate significant impurity or impurities, donors and acceptors, as dictated by the type of contact to be provided. The contact metal in any case comprises a substantial proportion of the charge and is a much greater proportion than would be used for merely doping or controlling the conductivity type of a semiconductor. In one embodiment of the invention, described later in detail, at least 50 percent aluminum is suggested because it was found that when the amount is less than that a series resistance appears. It should be noted then that the present invention is concerned not merely with a doped region of a semiconductor body but one having sufficient metal contact to serve as an electrode.

In one embodiment of the invention in forming the emitter stripe, a p-type germanium slice is placed in a vacuum chamber so that one side of the n-type base region faces the source of the emitter material. A mask is then placed over the base region and a charge of germanium and aluminum is heated in a filament to deposit the germanium-aluminum eutectic on the base surface through an opening in the mask. The temperature of the germanium body is raised from the stabilization level to the alloying temperature and held for a specified time interval before being lowered to the pre-alloy stabilization level. It is significant that the semiconductor body may be held at an alloying temperature for a relatively large time interval without adverse effect. This eliminates the critical temperature peak described above and greatly relaxes the temperature control requirements. More significantly, a high quality product of relatively high yield results, having good electrical and mechanical properties with uniform alloying. Depth control and uniform junction formation is also enhanced, since the change of breakthrough of the aluminum to the collector region is minimized. Transistors produced in accordance with the instant invention have higher gain and better reproducibility of electrical parameters.

While the invention is described in relation to a particular type of transistor of a particular semiconductor material and significant impurities, it may have obvious applicability, not only to transistors, but to diodes and semiconductors generally, to silicon and other semiconductor materials, and to different significant impurities. Likewise, the invention may be used with a variety of metals. Only a single opening in a mask is described, but in actual practice, there are many openings designed to simultaneously pass the vaporized material to the surface of a semiconductor slice. The slice, of course, is later cut into individual wafers used in the fabrication of transistors.

The invention will now be described by reference to the drawings wherein.

Figure 1:
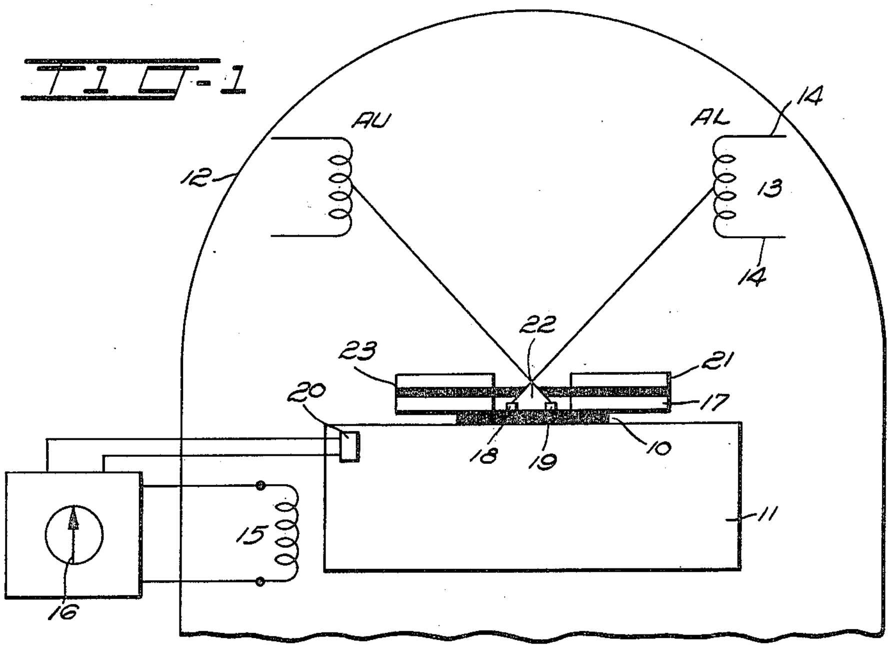
FIG. 1 is a schematic drawing of apparatus which may be used in practicing the invention.

In FIG. 1 of the drawings, the apparatus for forming stripes on a monocrystalline germanium slice 10 includes an evaporation jig 11 enclosed within a bell jar 12 and a filament 13 for holding a charge having leads 14 connectible to a suitable current source (not shown). A heat source 15 is controlled by a controller 16 provided for regulating the jig temperature and concomitantly the temperature of the germanium slice. A thermocouple 20 may be provided to obtain the temperature of the jig 11 to regulated controller 16.

It will be assumed that the slice 10 shown in FIG. 1 is of germanium-indium, that is, p-type, having a diffused n-type base layer provided by the vapor-solid diffusion of arsenic or antimony into the surface of the slice by use of a carrier gas. The slice may be one in which the doping of the germanium-indium takes place during tre crystal growing process.

In carrying out the process, the slice 10 is placed on the jig 11. The spacer 17 is placed over the slice so that both the aluminum emitter stripe 18 and the gold base stripe 19 may be formed on the slice in the same jig by succeeding evaporation and alloying steps in a manner well known to the art. The mask 21 having an opening 22 is positioned over the spacer 17, and a spacer 23 is in turn positioned over the mask 21. Suitable means may be used for providing downward pressure on the spacer 23 to hold the assembly in place.

Thereafter, a germanium charge of the same conductivity type as the slice, and having a bulk resistivity comparable to that of the slice, is selected. The charge is cleaned by first placing it in approximately 10 cc. of hydrofluoric acid for five minutes, rinsing in water, dipping in clean acetone and then air drying. The material so treated may be broken into convenient pieces for loading into the evaporation filament 13. Alternately, small charges of germanium may be treated as indicated and used directly in the evaporation process.

In preparing the aluminum charge, a length of aluminum wire is selected which is cleaned by the use of trichlorethylene and acetone and then blown dry and etched for one minute in a ten percent sodium hydroxide solution, after which the aluminum is rinsed with water. The wire is bent into a convenient shape for loading into the evaporation filament. The cleaning procedure is preferably repeated before the charge of aluminum is loaded into the filament.

The percentages of germanium-indium and aluminum used may vary over a considerable range. A weight percent range from approximately 15 percent germanium and 85 percent aluminum to approximately 50 percent germanium and 50 percent aluminum is indicated. The yield appears to be particularly good when the proportions are approximately 25 percent germanium and 75 percent aluminum. Significantly, this is in the region of the eutectic point of the germanium-aluminum eutectic system where the aluminum will draw or combine with a minimum of germanium to form the alloy. When the percentage of germanium moves below 15 percent, the undesirable conditions described above begin to appear in view of the predominance of aluminum. On the other hand, when the percentage of germanium begins to exceed 25 percent, a series resistance which may be undesirable appears in the emitter contact in the completed transistor during operation.

After the charge has been inserted in the filament 13, the bell jar 12 is evacuated or an inert gas is introduced. Heating current is then passed through the filament for a time sufficient to evaporate the charge to extinction, and deposite the aluminum and germanium in particle form through the mask onto the surface of the base region of the slice. The temperature of the jig is stabilized at approximately 330° C. and then raised to approximately 525° C. for alloying and held at that temperature preferably for about 5 to 10 minutes. The latter temperature is maintained long enough to assure the formation of an emitter stripe having the required electrical and mechanical properties. The temperature is then returned to the stabilization level. While 525° C. has been used as an alloy temperature, this is because stripes so alloyed are better able to withstand high temperatures encountered during subsequent assembly steps. Actually, alloying may commence at the eutectic melting point of 424° C.

Figure 2:
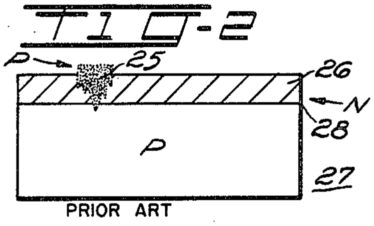
FIG. 2 shows a semiconductor having an alloyed emitter formed according to a prior art technique.
Figure 3:
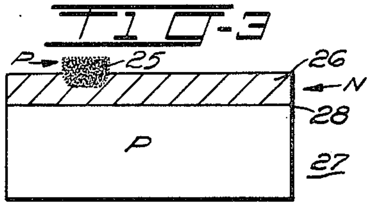
PRIOR ART FIG. 3
FIG. 3 shows a semiconductor having an alloyer emitter formed according to the present invention.

FIG. 2 illustrates an alloyed emitter 25 formed in the base region 26 of a semiconductor body 27 according to the prior art technique, whereas FIG. 3 illustrates an alloyed emitter 25 formed in accordance with the present invention. It is readily seen in FIG. 2 that the alloyed emitter stripe (which is of p-type) has a jagged leading edge, and at one point there is actually a puncture through the collector base junction 28. On the other hand, it is clear from FIG. 3 that a uniformly alloyed emitter is formed in a portion of the base region 26. It has been hypothesized that the sharp puncture through or spikes in the alloyed area in the prior art are due to the tendency of the aluminum to follow or to alloy more easily along along dislocations in the lattice structure of the semiconductor crystal. By reason of the use of eutectic evaporation of the semiconductor material and the metal, stable or equilibrium conditions are present at the onset of alloying and uniform alloying results.

Figure 4:
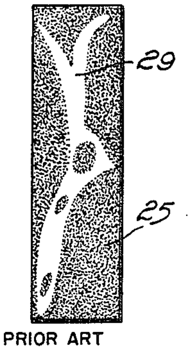
FIG. 4 illustrates a semiconductor having a "cratered" emitter.
Figure 5:
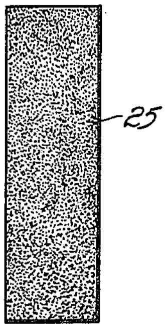
PRIOR ART FIG. 5
FIG. 5 illustrates a semiconductor having an emitter alloyed according to the present invention.

Further, by comparison of FIG. 4 with FIG. 5 it can be seen that the prior art practice represented in FIG. 4 resulted in "cratering" or non-wetting of the aluminum stripe, as indicated by the area 29. Contrawise, it is seen that the emitter stripe 25 shown in FIG. 5, formed according to the present method, is completely homogeneous throughout and entirely wets the base region of the semiconductor body.

Figure 6:
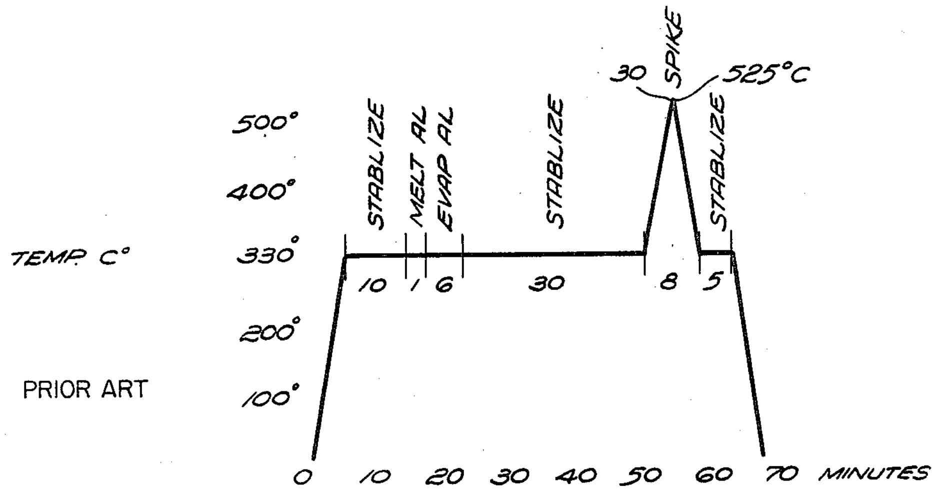
FIG. 6 is a temperature vs. time chart depicting prior art conditions.

FIG. 6 is a temperature chart depicting prior art heating conditions for the evaporation cycle using an aluminum emitter.

Figure 7:
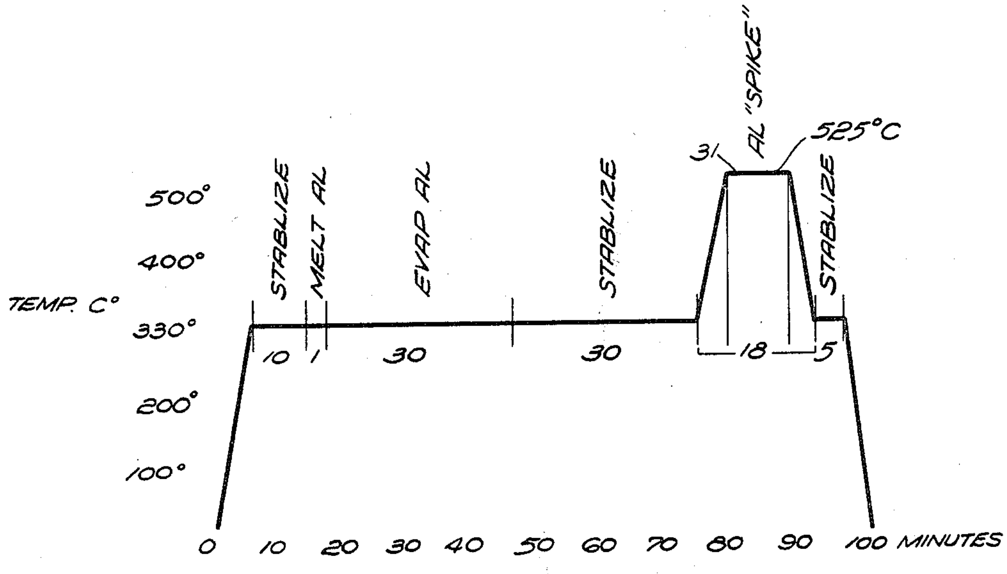
FIG. 7 is a temperature time chart depicting conditions according to the present method.

FIG. 7 is a similar temperature chart of an evaporation cycle for forming an aluminum-germanium emitter as previously described. The temperature charts are self-evident, but it should be pointed out that the temperature peak or spike shown in FIG. 6 at 30 has been replaced by the plateau 31 in FIG. 7. It is the elimination of that temperature peak which substantially reduces the criticalness in the temperature control phase of the process.

While the invention has been described to a large extent with respect to the formation of an aluminum stripe, significant improvement has also followed in the formation of the gold base stripe. In this procedure, antimony doped n-type germanium is used in the charge along with the gold to form an ohmic connection.

The invention has been described in connection with the aluminum and gold stripes of a diffused base transistor, but it should find application generally in semiconductors where it is desirable to have uniformly alloyed contact regions with good electrical and mechanical properties. Suitable electrical connections are made to the emitter and base stripes, and the collector region, in the fabrication of the transistor which may include the usual header and can assembly.

In a typical case, a p-type germanium slice may have a bulk resistivity of the order of 1/10 ohm cm.², the aluminum stripe is approximately 1 mil x 6 mils with a thickness of approximately 5000 A. units, and the diffused base region is about 1 micron in thickness. Thus, the present invention deals with an extremely thin surface layer.

Various changes may be made in the invention without departure from its spirit and scope, the present description being only an illustrative embodiment.

What is claimed is:

1. Method of forming an alloyed contact region, which serves as an electrode, in an extremely thin surface layer of a semiconductor body which comprises vapor depositing on a layer of the body semiconductor material of the same elemental form as the material of the body together with at least 50 percent metal contact material, raising the temperature of the body above the melting point of the semiconductor metal conact eutectic temperature and below the melting point of the body, maintaining the body at a temperature plateau substantially at the raised temperature for at least several minutes, and then lowering the temperature below the said melting point.

2. Method according to claim 1 wherein the thin surface layer is of one conductivity type and the contact metal is of a type which converts the surface layer at the region of deposition to the opposite conductivity type.

3. Method according to claim 1 wherein the contact metal is aluminum.

4. Method according to claim 1 wherein the contact metal is gold.

5. Method of forming an alloyed contact region, which serves as an electrode, in an extremely thin surface layer of a semiconductor body of germanium which comprises vapor depositing on a localized region of a layer of the body from approximately 15 percent germanium and 85 percent aluminum to approximately 50 percent germanium and 50 percent aluminum, maintaining the temperature of the body between 424° C. and 525° C. for about 5 to 10 minutes, and then lowering the temperatuer to cool the semiconductor body.

References Cited in the file of this patent

UNITED STATES PATENTS

| | | |
|---|---|---|
| 2,629,672 | Sparks | Feb. 24, 1953 |
| 2,765,245 | English et al. | Oct. 2, 1956 |
| 2,780,569 | Hewlett | Feb. 5, 1957 |
| 2,854,366 | Wannlund et al. | Sept. 30, 1958 |
| 2,877,147 | Thurmond | Mar. 10, 1959 |
| 2,909,453 | Losco et al. | Oct. 20, 1959 |

FOREIGN PATENTS

| | | |
|---|---|---|
| 537,909 | Canada | Mar. 5, 1957 |
| 735,986 | Great Britain | Aug. 31, 1955 |
| 1,075,223 | Germany | Feb. 11, 1960 |